US008850852B2

(12) United States Patent
Burgard et al.

(10) Patent No.: US 8,850,852 B2
(45) Date of Patent: Oct. 7, 2014

(54) EDGE PROCESSING OF PHOTOVOLTAIC SUBSTRATES

(75) Inventors: Daniel Burgard, Wauseon, OH (US); Joshua Conley, Sylvania, OH (US); James Hinkle, Toledo, OH (US); Stephen Murphy, Perrysburg, OH (US); Thomas Truman, Toledo, OH (US)

(73) Assignee: First Solar, Inc, Perrysburg, OH (US)

( * ) Notice: Subject to any disclaimer, the term of this patent is extended or adjusted under 35 U.S.C. 154(b) by 148 days.

(21) Appl. No.: 13/170,390

(22) Filed: Jun. 28, 2011

(65) Prior Publication Data

US 2012/0000247 A1 Jan. 5, 2012

Related U.S. Application Data

(60) Provisional application No. 61/360,173, filed on Jun. 30, 2010.

(51) Int. Cl.

| | |
|---|---|
| ***C03B 25/08*** | (2006.01) |
| ***B23K 26/40*** | (2014.01) |
| ***C03B 35/18*** | (2006.01) |
| ***C03B 25/02*** | (2006.01) |
| ***B65G 49/06*** | (2006.01) |
| ***H01L 31/18*** | (2006.01) |
| ***B24B 1/00*** | (2006.01) |
| ***H01L 31/0392*** | (2006.01) |
| ***B24B 9/10*** | (2006.01) |
| ***B23K 26/36*** | (2014.01) |
| ***C03B 29/02*** | (2006.01) |

(52) U.S. Cl.

CPC .......... *C03B 25/025* (2013.01); *B23K 26/4075* (2013.01); *C03B 35/181* (2013.01); *B65G 49/068* (2013.01); *H01L 31/1876* (2013.01); *B65G 49/069* (2013.01); *B24B 1/00* (2013.01); *H01L 31/03921* (2013.01); *B24B 9/10* (2013.01); *Y02E 10/50* (2013.01); *B23K 26/362* (2013.01); *C03B 29/025* (2013.01); *H01L 31/1864* (2013.01)

USPC .................................. 65/61; 65/117; 65/118

(58) Field of Classification Search

CPC .... B23K 26/362; B23K 26/4075; B24B 1/00; B24B 9/10; B65G 49/068; B65G 49/069; C03B 29/025; C03B 35/181; C03B 25/025

USPC ............................................ 65/61, 117, 118

See application file for complete search history.

(56) References Cited

U.S. PATENT DOCUMENTS

| | | | | |
|---|---|---|---|---|
| 1,841,060 | A * | 1/1932 | Russell ........................... | 65/118 |
| 3,652,246 | A * | 3/1972 | Michelotti et al. .............. | 65/181 |

(Continued)

FOREIGN PATENT DOCUMENTS

| | | | | |
|---|---|---|---|---|
| DE | 10 2005 047 431 | A1 | | 4/2007 |
| GB | 2 148 145 | A | | 5/1985 |
| JP | 05330835 | A | * | 12/1993 |
| JP | 11-199007 | A | | 7/1999 |

OTHER PUBLICATIONS

JP 05-330835, Hamano K., Slow Cooling Method for Glass Plate, Dec. 14, 1993.*

*Primary Examiner* — Queenie Dehghan
(74) *Attorney, Agent, or Firm* — Dickstein Shapiro LLP

(57) ABSTRACT

A method for processing a coated glass substrate may include a high-temperature activation process.

30 Claims, 3 Drawing Sheets

101 Edge grinding process
102 Wash substrate
103 Group substrates into batches of 1 or more
104 Anneal substrate
105 Stack substrates

(56) References Cited

U.S. PATENT DOCUMENTS

| | | | | |
|---|---|---|---|---|
| 3,666,534 | A * | 5/1972 | Groth et al. | 427/106 |
| 3,843,472 | A * | 10/1974 | Toussaint et al. | 428/192 |
| 4,162,907 | A * | 7/1979 | Anderson | 65/29.17 |
| 4,617,043 | A * | 10/1986 | Reunamaki | 65/114 |
| 5,169,423 | A * | 12/1992 | Yoshizawa et al. | 65/106 |
| 5,372,646 | A | 12/1994 | Foote et al. | |
| 5,707,412 | A * | 1/1998 | Franz et al. | 65/24 |
| 5,711,778 | A * | 1/1998 | House | 65/117 |
| 6,288,325 | B1 | 9/2001 | Jansen et al. | |
| 2003/0044539 | A1 | 3/2003 | Oswald | |
| 2004/0194508 | A1* | 10/2004 | Nishimoto et al. | 65/33.1 |
| 2004/0237591 | A1* | 12/2004 | Shetterly et al. | 65/111 |
| 2005/0020087 | A1* | 1/2005 | Wagner et al. | 438/700 |
| 2005/0210921 | A1* | 9/2005 | Richardson et al. | 65/23 |
| 2008/0202167 | A1* | 8/2008 | Cavallaro et al. | 65/104 |
| 2010/0047954 | A1 | 2/2010 | Su et al. | |
| 2011/0104427 | A1* | 5/2011 | Suzuki | 428/64.2 |

* cited by examiner 201
220
200
201
220
200
30
32

EDGE PROCESSING OF PHOTOVOLTAIC SUBSTRATES

CLAIM OF PRIORITY

This application claims priority under 35 U.S.C. §119(e) to U.S. Provisional Patent Application Ser. No. 61/360,173 filed on Jun. 30, 2010, which is hereby incorporated by reference in its entirety.

TECHNICAL FIELD

The present invention relates to photovoltaic modules and methods of production.

BACKGROUND

Photovoltaic modules can include one or more layers of coating formed adjacent to a substrate. Current methods of processing multiple coated substrates are inefficient.

DETAILED DESCRIPTION

Figure 1:
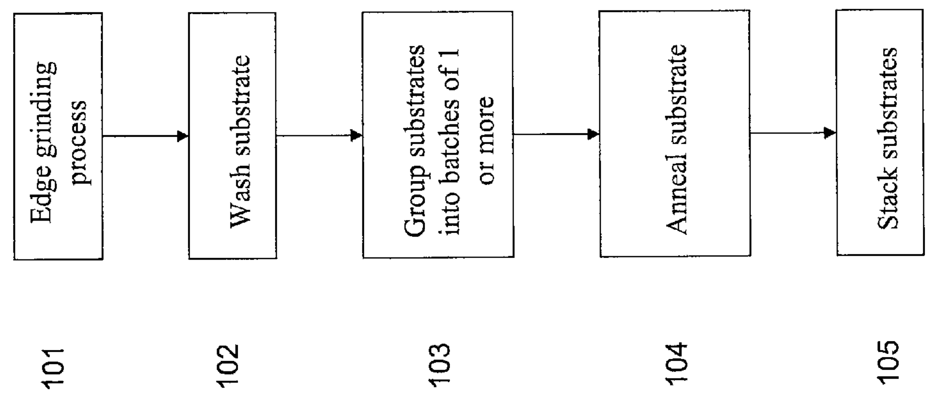
FIG. 1 is a flowchart of an automated method for processing multiple substrates.

Photovoltaic modules can include multiple layers of coating created adjacent to a substrate (or superstrate). The substrate may include any suitable substrate material, including, for example, glass. For example, a photovoltaic module can include a barrier layer, a transparent conductive oxide (TCO) layer, a buffer layer, a semiconductor window layer, and a semiconductor absorber layer, formed in a stack on a glass substrate. A method of processing substrates in a high-volume fully-automated mode may include a high-temperature activation process. For example, one or more glass substrates may be loaded into an edge processing chamber. The glass substrates may include one or more layers of coating. The edges of the glass substrates may be processed for durability using an edge shaping process (e.g., edge grinding). The glass substrates may then be washed or accumulated in an enclosure for rinsing the substrates. A conveyor may then be used to group the glass substrates into any suitable sized batch, including, for example, batches of 1 or more, 2 or more, or 3 or more. The glass substrates may then be processed in a thermal processing chamber (e.g., a high-temperature low-oxygen roller hearth), after which the glass may be inspected. Separation media may be applied, and the glass may be stacked without physically contacting the coated surface.

In one aspect, a method of processing a substrate may include shaping an edge of one or more glass substrates. The method may include washing the one or more glass substrates. The method may include grouping the one or more glass substrates into batches of 1 or more. The method may include annealing each batch. The method may include stacking each of the one or more glass substrates.

The shaping may include grinding one or more edges. The method may include loading the one or more glass substrates into a thermal processing chamber. Each one of the one or more glass substrates may include a coated surface. The loading may include transporting the one or more glass substrates without physically contacting any one of the coated surfaces. The loading may include placing the one or more glass substrates on one or more ceramic rollers. The thermal processing chamber may include the one or more ceramic rollers. The method may include oscillating the one or more ceramic rollers back and forth during the annealing. Each one of the one or more glass substrates may include a coated surface. The stacking may include positioning each one of the one or more glass substrates vertically adjacent to one another such that a coated surface does not contact a bottom surface of a vertically adjacent substrate. The stacking may include applying glass separation media between the one or more glass substrates. The annealing may include heating one or more glass substrates above about 300 degrees C. The annealing may include heating one or more glass substrates below about 800 degrees C. The annealing may include heating one or more glass substrates for more than about 5 minutes. The annealing may include heating one or more glass substrates for less than about 30 minutes. The annealing may include heating one or more glass substrates in an ambient. The annealing may include heating one or more glass substrates in an atmosphere including a forming gas. The annealing may include heating one or more glass substrates in an atmosphere including a hydrogen gas. The annealing may include heating one or more glass substrates in an atmosphere including a nitrogen gas. The annealing may include heating one or more glass substrates in an atmosphere including an oxygen gas. The washing may include depositing each one of the one or more glass substrates in a receptacle. The washing may include rinsing each one of the one or more glass substrates in a solution. The annealing may include heating one or more glass substrates in a roller hearth. The annealing may include heating one or more glass substrates in a thermal processing chamber. The annealing may include heating one or more glass substrates in a muffle tube oven. The annealing may include heating one or more glass substrates in a belt furnace. The grouping may include aggregating one or more glass substrates into batches of 1 or more. The grouping may include aggregating one or more glass substrates into batches of 3 or less. The grouping may include aggregating one or more glass substrates into batches including a side-by-side configuration. The grouping may include aggregating one or more glass substrates into batches including a stacked configuration. The method may include inspecting the one or more glass substrates after annealing each batch.

FIG. 1 includes a flowchart illustrating a method for processing substrates in a high-volume fully-automated mode, which method may include a high-temperature activation process. At step 101, one or more substrates may undergo an edge grinding process, during which one or more edges of the substrate may be grinded. (Step 101 may also including any other suitable edge shaping process). The edge grinding process may be executed using any suitable instrument, including, for example, any suitable mechanical or optical tool. For example, the edge grinding process may consist of directing one or more lasers at one or more edges of the substrate. The edge grinding process may consist of reducing one or more portions of one or more edges of the substrate. For example, the edge grinding process may consist of rounding one or more edges of the substrate. For example, following the edge grinding process, the substrate may have one or more substantially rounded edges. Following the edge grinding process, one or more edges of the substrate may exhibit improved durability. The substrate may include any suitable substrate material, including, for example, glass (e.g., soda-lime glass).

For example, the edge grinding process may yield a glass substrate with one or more rounded edges, with improved durability. The substrate may include one or more layers of coating, and one or more edges of the substrate may be substantially free of the one or more layers of coating. The edge grinding process may take place in any suitable environment, including, for example, at any suitable temperature, including, for example, more than about 10 degrees C., more than about 20 degrees C., less than about 50 degrees C., less than about 40 degrees C., or less than about 50 degrees C. The edge grinding process may take place at a temperature between about 20 degrees C. and about 30 degrees C.

Figure 2A:
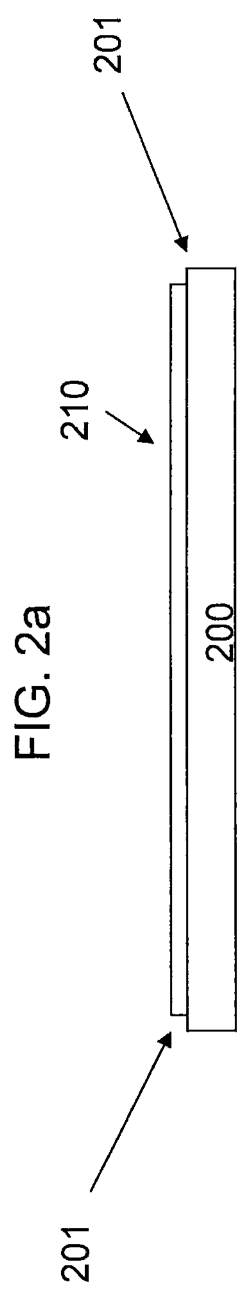
FIG. 2*a* depicts a glass substrate with a coating layer formed adjacent thereto.

FIG. 2*a* depicts a sample substrate with a coating layer formed adjacent thereto. Specifically, FIG. 2*a* depicts a substrate 200 with a coating layer 210. Substrate 200 may include any suitable substrate material, including, for example, a glass (e.g., soda-lime glass). Coating layer 210 may include any suitable photovoltaic module coating, including, for example, a transparent conductive oxide layer, a transparent conductive oxide stack, one or more barrier layers, one or more buffer layers, one or more semiconductor layers, and/or one or more back contact layers. Coating layer 210 may include a single layer of a single material, or coating layer 210 may include multiple layers of one or more separate materials. For example, coating layer 210 may include a transparent conductive oxide stack, which may include, for example, a barrier layer, a transparent conductive oxide layer, and a buffer layer, all adjacent to one another on substrate 200. For example, coating layer 210 may include a transparent conductive oxide layer, which may include any suitable conductive material, including, for example, a layer of cadmium and tin, or zinc and tin. Coating layer 210 may occupy a substantial amount of surface area on substrate 200, including substantially all of the surface area of substrate 200. The surface of substrate 200 may have one or more areas free of coating layer 210. For example, one or more edges 201 of substrate 200 may be substantially free of any portion of coating layer 210. For example, prior to processing, substrate 200, with coating layer 210, may undergo an edge deletion process, during which one or more portions of coating may be removed. Such an edge deletion process may be used to remove coating from edges 201 of substrate 200, leaving one or more exposed portions along the surface of substrate 200. Edges 201, free of coating material, may be used for handling of substrate 200.

Referring back to FIG. 1, by way of example, at step 101, one or more substrates 200 with coating layers 210 may be loaded into an edge processing chamber, without physically contacting any portion of the coating layers 210. The coating-free edges 201 may be used to transport any of the substrates 200 having coating layers 210 into the edge processing chamber for grinding of one or more edges 201 of each substrate 200. Following the edge grinding process, at step 102, the coated glass substrates may be washed to remove any unwanted material, coating, or debris. A variety of techniques may be used to wash the substrates. For example, the coated glass substrates may be deposited into a receptacle for rinsing. Following washing, at step 103, the coated glass substrates may be grouped into batches of any suitable number, including, for example, 1 or more, 2 or more, 3 or more, or 4 or less. At step 104, the coated glass substrates may be loaded into a thermal processing chamber for high-temperature heat treatment. Any suitable thermal processing chamber may be used for step 104, including, for example, any appropriate oven or furnace, including, for example, a muffle tube oven or a belt furnace. The furnace or oven may have ceramic rollers, on which the coated glass substrate may be transported through the oven or furnace. The thermal processing chamber may have a controlled environment, which may include an ambient condition. The thermal processing chamber may have one or more zones, each of which may contain a unique set of controlled conditions. For example, the thermal processing chamber may include a first zone proximate to a point of entry for the coated glass substrate, and may include a substantially low-pressure environment. A second zone, at least partially separate and distinct from the first, may include a slightly over-pressurized environment. The thermal processing chamber may include ceramic rollers to transport the coated glass substrate between the first and second zones and/or between any additional zones within the chamber. The thermal processing chamber may include one or more zones with an inert atmosphere.

The thermal processing chamber may be configured to process more than one coated glass substrate at a time. For example, the thermal processing chamber may be configured to process 1 or more, 2 or more, 3 or more, or less than 4 coated glass substrates at a time. The thermal processing chamber may be configured to process and/or output a high volume of substrates. For example, the thermal processing chamber may be configured to process 2 or more substrates, positioned side-by-side. The thermal processing chamber may also be configured to house one or more coated glass substrates in a stacked orientation. Each substrate within a batch of 2 or more substrates to be processed may be offloaded one at a time, or concurrent with the other substrates within the respective batch. The thermal processing chamber may be configured to process the coated glass substrates at any suitable speed. For example, the thermal processing chamber may include a belt furnace configured to accelerate or decelerate the processing speed. The belt furnace may adjust the processing speed in response to any one of a variety of parameters, including, for example, temperature. The thermal processing chamber may also be configured to deposit one or more layers using a variety of deposition techniques, including, for example, vapor transport deposition. The vapor transport deposition of one or more layers may supply the annealing step for one or more coating layers on the substrate.

Figure 2B:
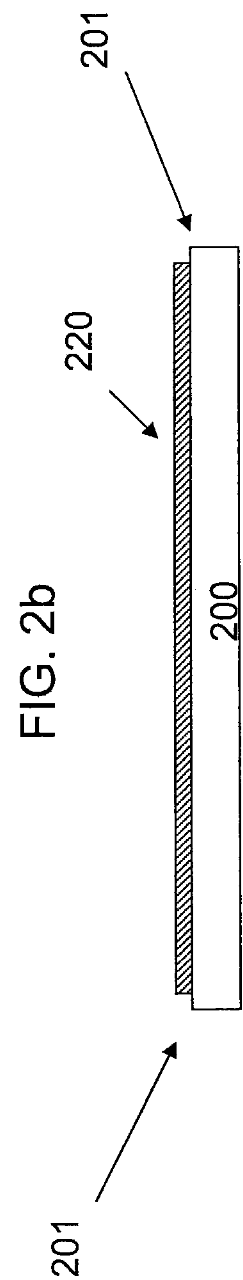
FIG. 2*b* depicts a glass substrate with a coating layer formed adjacent thereto.

The thermal processing chamber may be equipped with rollers, which may be configured to oscillate the substrates back and forth during a cooling process, following the ramp-up and soak periods of the annealing process. The coated glass substrates may be cooled for any suitable duration. For example, the coated glass substrates may undergo a substantially fast cooling process. During the cooling process, one or more atmospheric conditions may be adjusted, including, for example, the level of oxygen gas in the chamber. For example, during the cooling of the coated glass substrates, the oxygen gas content in the chamber may be kept substantially low, or alternatively, substantially high. The atmospheric conditions in the chamber may include a gas including any suitable oxygen content, including, for example, more than about 70%, more than about 80%, more than about 90%, or less than about 95% oxygen gas, or more than about 1%, more than about 5%, more than about 10%, more than about 20%, less than about 30%, less than about 15%, or less than about 2% oxygen gas. The annealing of substrate 200 with coating layer 210 from FIG. 2*a* can yield annealed coating layer 220 from FIG. 2*b*. Annealed coating layer 220 can have a more robust composition than its pre-anneal counterpart. For example, for a coating layer 220, including a semiconductor absorber layer, the anneal step can substantially reduce the number of defects, thereby improving the carrier concentration of a resulting photovoltaic module.

The substrate may be annealed at any suitable temperature to optimize performance of a resulting photovoltaic device. For example, one or more substrates may be annealed at a temperature of more than about 300 degrees C., more than about 400 degrees C., more than about 500 degrees C., less than about 800 degrees C., less than about 700 degrees C., or less than about 600 degrees C. The one or more substrates may be annealed for any suitable duration, including, for example, more than about 30 seconds, more than about 1 minute, more than about 5 minutes, more than about 10 minutes, more than about 15 minutes, less than about 30 minutes, less than about 25 minutes, or less than about 20 minutes.

The substrates may be annealed using any suitable means. For example, one or more substrates may be loaded into a thermal processing chamber configured to receive one or more gases. For example, the one or more substrates may be loaded into a thermal processing chamber and annealed in an ambient. For example, a forming gas ambient may be formed within the thermal processing chamber by flowing appropriate quantities of hydrogen and nitrogen gas into the chamber during the annealing step. Any suitable ratio of nitrogen to hydrogen gas may be incorporated into the annealing process. For example, the ambient may include more than about 70%, more than about 80%, more than about 90%, or less than about 95% nitrogen gas, and/or more than about 1%, more than about 5%, more than about 10%, more than about 20%, less than about 30%, less than about 15%, or less than about 2% hydrogen gas. Any suitable gas may be deposited into the thermal processing chamber to achieve optimum processing of the substrates. For example, appropriate quantities of oxygen and/or argon gas may be fed into the thermal processing chamber during annealing.

The annealing process at step 104 may include a substantially fast ramp-up phase, followed by an appropriate soaking period, and a subsequent cool-down period. Each phase may take place for any suitable duration. For example, the ramp-up phase may occur for a substantially short duration, for example, less than about 1 minute, or less than about 30 seconds. Alternatively, the ramp-up phase can take substantially longer to occur, including, for, example, more than about 1 minute, more than about 2 minutes, more than about 5 minutes, or less than about 10 minutes. Similarly, the cool-down period can take place for a short or long duration, including, for example, more than about 1 minute, more than about 2 minutes, more than about 5 minutes, or less than about 10 minutes. The soak time can be defined substantially by the "anneal" time (i.e., for a 15 minute anneal, the soak time may be about 15 minutes). The annealing can result in more efficient and robust coating layers on the substrate. For example, the annealing can eliminate, or otherwise substantially reduce, defects in one or more coating layers on the substrate. Elimination of such defects can result in a higher carrier concentration, thereby leading to improved photovoltaic device performance.

Figure 3:
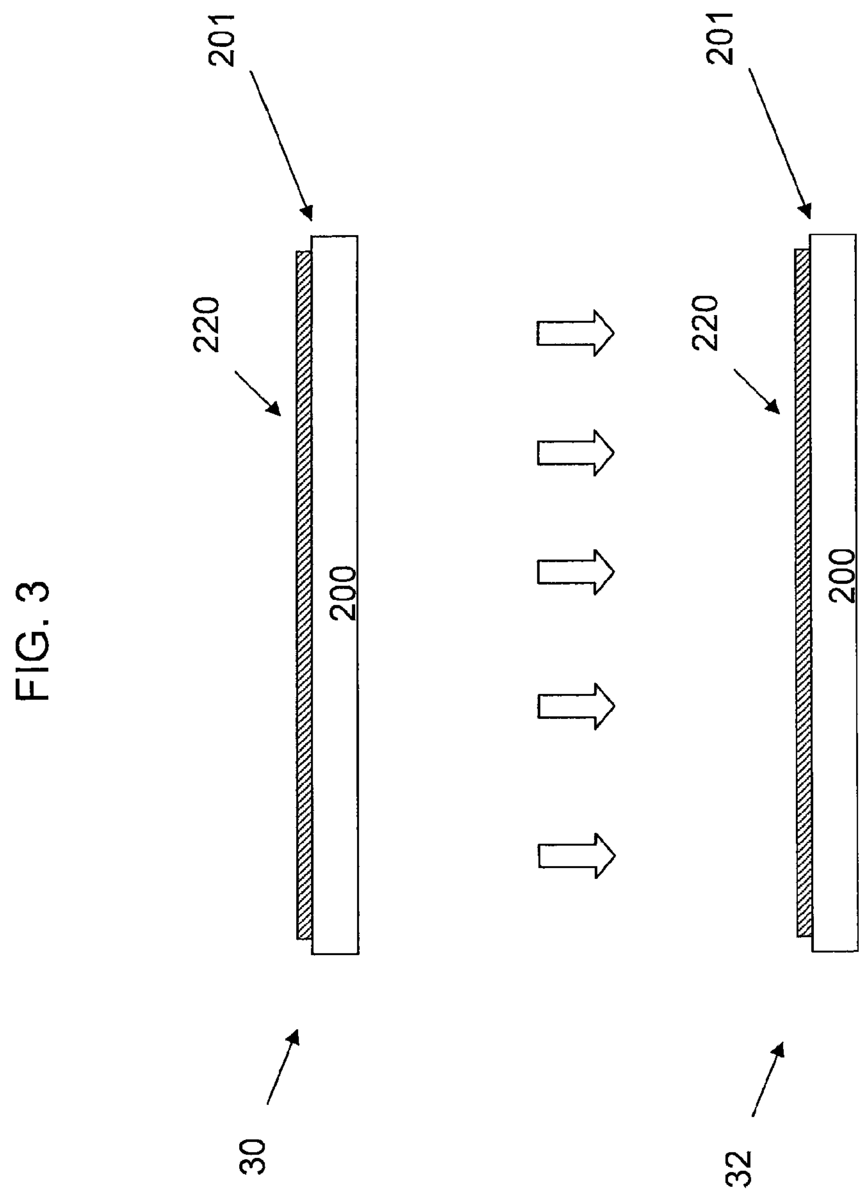
FIG. 3 depicts a process for stacking multiple coated substrates.

Following the anneal step at 104, the coated glass substrates may be positioned in a preferred orientation for future processing. For example, at step 105, the coated glass substrates may be stacked adjacent to one another. FIG. 3 depicts a coated glass substrate 30 being vertically stacked adjacent to a coated glass substrate 32. Glass separation media may be applied between each coated glass substrate to separate the annealed coating layer 220 of coated glass substrate 32 from the bottom surface of substrate 200 of coated glass substrate 30. One or more additional coated glass substrates may be stacked upon coated glass substrate 30, with additional separation media, to avoid physical contact coating layers and the substrates stacked above. Any suitable number of substrates may be vertically stacked, including, for example, 2 or more, 5 or more, 10 or more, or 15 or less.

Substrates processed using the methods and systems discussed herein may be used for manufacturing one or more photovoltaic cells, which may be incorporated into one or more photovoltaic modules. For example, substrates processed using the aforementioned methods and systems may have various layers deposited upon them, including, for example, one or more photovoltaic device layers (e.g., cadmium telluride). Photovoltaic cells fabricated therefrom may be incorporated into one or more photovoltaic modules, which may include one or more submodules. The photovoltaic modules may by incorporated into various systems for generating electricity. For example, a photovoltaic module may include one or more submodules consisting of multiple photovoltaic cells connected in series. One or more submodules may be connected in parallel via a shared cell to form a photovoltaic module.

A bus bar assembly may be attached to a contact surface of a photovoltaic module to enable connection to additional electrical components (e.g., one or more additional modules). For example, a first strip of double-sided tape may be distributed along a length of the module, and a first lead foil may be applied adjacent thereto. A second strip of double-sided tape (smaller than the first strip) may be applied adjacent to the first lead foil. A second lead foil may be applied adjacent to the second strip of double-sided tape. The tape and lead foils may be positioned such that at least one portion of the first lead foil is exposed, and at least one portion of the second lead foil is exposed. Following application of the tape and lead foils, a plurality of bus bars may be positioned along the contact region of the module. The bus bars may be positioned parallel from one another, at any suitable distance apart. For example, the plurality of bus bars may include at least one bus bar positioned on a portion of the first lead foil, and at least one bus bar positioned on a portion of the second lead foil. The bus bar, along with the portion of lead foil on which it has been applied, may define a positive or negative region. A roller may be used to create a loop in a section of the first or second lead foil. The loop may be threaded through the hole of a subsequently deposited back glass. The photovoltaic module may be connected to other electronic components, including, for example, one or more additional photovoltaic modules. For example, the photovoltaic module may be electrically connected to one or more additional photovoltaic modules to form a photovoltaic array.

The photovoltaic cells/modules/arrays may be included in a system for generating electricity. For example, a photovoltaic cell may be illuminated with a beam of light to generate a photocurrent. The photocurrent may be collected and converted from direct current (DC) to alternating current (AC) and distributed to a power grid. Light of any suitable wavelength may be directed at the cell to produce the photocurrent, including, for example, more than 400 nm, or less than 700 nm (e.g., ultraviolet light). Photocurrent generated from one photovoltaic cell may be combined with photocurrent generated from other photovoltaic cells. For example, the photovoltaic cells may be part of one or more photovoltaic modules in a photovoltaic array, from which the aggregate current may be harnessed and distributed.

The embodiments described above are offered by way of illustration and example. It should be understood that the examples provided above may be altered in certain respects and still remain within the scope of the claims. It should be appreciated that, while the invention has been described with reference to the above preferred embodiments, other embodiments are within the scope of the claims.

What is claimed is:

1. A method of processing a plurality of coated glass photovoltaic substrates, the method comprising:

removing a coating from one or more edges of each of a plurality of photovoltaic glass substrates having a coated surface;

after removing the coating, shaping an edge of each of the plurality of glass substrates;

after shaping the edge of each of the plurality of glass substrates, washing the plurality of glass substrates;

after washing the plurality of glass substrates, grouping the plurality of glass substrates into batches for annealing, each batch comprising two or more of the plurality of glass substrates; and, batch annealing the entirety of each of the plurality of grouped glass substrates.

2. The method of claim 1, wherein the shaping comprises grinding one or more edges of each of the plurality of glass substrates.

3. The method of claim 1, wherein the annealing further comprises loading each batch of glass substrates into a thermal processing chamber, and the loading comprises transporting each of the plurality of glass substrates using the one or more edges from which the coated surface is removed and without physically contacting the coated surface thereof.

4. The method of claim 3, wherein the loading further comprises placing the plurality of glass substrates on one or more ceramic rollers, wherein the thermal processing chamber comprises the one or more ceramic rollers.

5. The method of claim 4, further comprising oscillating the one or more ceramic rollers back and forth during the annealing.

6. The method of claim 1, further comprising stacking the plurality of annealed glass substrates by positioning each of the plurality of glass substrates vertically adjacent to one another such that a coated surface of one of the plurality of glass substrates does not contact a bottom surface of a vertically adjacent one of the plurality of glass substrates.

7. The method of claim 6, wherein the stacking further comprises applying glass separation media between each of the plurality of glass substrates.

8. The method of claim 1, wherein the annealing comprises heating each batch of glass substrates above about 300 degrees C.

9. The method of claim 1, wherein the annealing comprises heating each batch of glass substrates below about 800 degrees C.

10. The method of claim 1, wherein the annealing comprises heating each batch of glass substrates for more than about 5 minutes.

11. The method of claim 1, wherein the annealing comprises heating each batch of glass substrates for less than about 30 minutes.

12. The method of claim 1, wherein the annealing comprises heating each batch of glass substrates under an ambient atmosphere condition.

13. The method of claim 1, wherein the annealing comprises heating each batch of glass substrates in an atmosphere comprising a forming gas.

14. The method of claim 1, wherein the annealing comprises heating each batch of glass substrates in an atmosphere comprising a hydrogen gas.

15. The method of claim 1, wherein the annealing comprises heating each batch of glass substrates in an atmosphere comprising a nitrogen gas.

16. The method of claim 1, wherein the annealing comprises heating each batch of glass substrates in an atmosphere comprising an oxygen gas.

17. The method of claim 1, wherein the washing comprises:

depositing each of the plurality of glass substrates in a receptacle; and rinsing each of the plurality of glass substrates in a solution.

18. The method of claim 1, wherein the annealing comprises heating the plurality of glass substrates in a roller hearth.

19. The method of claim 1, wherein the annealing comprises heating the plurality of glass substrates in a thermal processing chamber.

20. The method of claim 1, wherein the annealing comprises heating the plurality of glass substrates in a muffle tube oven.

21. The method of claim 1, wherein the annealing comprises heating the plurality of glass substrates in a belt furnace.

22. The method of claim 1, wherein the grouping comprises aggregating the plurality of glass substrates into batches of two or more.

23. The method of claim 1, wherein the grouping comprises aggregating the plurality of glass substrates into batches of three or less.

24. The method of claim 1, wherein the grouping comprises aggregating the plurality of glass substrates into batches comprising a side-by-side configuration.

25. The method of claim 1, wherein the grouping comprises aggregating the plurality of glass substrates into batches comprising a stacked configuration.

26. The method of claim 1, further comprising inspecting the plurality of glass substrates after annealing each batch.

27. The method of claim 1, wherein the plurality of coated glass substrates are each coated with at least one photovoltaic module material.

28. The method as in claim 27, wherein the photovoltaic module material comprises a transparent conductive oxide material layer.

29. The method as in claim 28, wherein the photovoltaic module material further comprises one or more semiconductor material layers.

30. The method as in claim 29, wherein the photovoltaic module material further comprises one or more back contact layers.

* * * * *